(12) United States Patent
Park et al.

(10) Patent No.: US 9,865,559 B2
(45) Date of Patent: Jan. 9, 2018

(54) METHOD FOR MANUFACTURING STRETCHABLE WIRE AND METHOD FOR MANUFACTURING STRETCHABLE INTEGRATED CIRCUIT

(71) Applicant: ELECTRONICS AND TELECOMMUNICATIONS RESEARCH INSTITUTE, Daejeon (KR)

(72) Inventors: Chan Woo Park, Daejeon (KR); Jae Bon Koo, Daejeon (KR); Bock Soon Na, Daejeon (KR); Rae-Man Park, Daejeon (KR); Ji-Young Oh, Daejeon (KR); Sang Seok Lee, Sejong (KR); Soon-Won Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/220,145

(22) Filed: Jul. 26, 2016

(65) Prior Publication Data
US 2017/0053894 A1 Feb. 23, 2017

(30) Foreign Application Priority Data

Aug. 21, 2015 (KR) .......... 10-2015-0118196
Jan. 22, 2016 (KR) .......... 10-2016-0008220

(51) Int. Cl.
*H01L 23/00* (2006.01)
*H01L 21/683* (2006.01)

(52) U.S. Cl.
CPC .......... *H01L 24/43* (2013.01); *H01L 21/6835* (2013.01); *H01L 24/24* (2013.01);
(Continued)

(58) Field of Classification Search
CPC ............. H01L 2924/00; H01L 2924/14; H01L 21/288; H01L 21/76838; H01L 21/6835;
(Continued)

(56) References Cited

U.S. PATENT DOCUMENTS 5,933,752 A * 8/1999 Yanagida ................ H01L 24/03
257/E23.021
2014/0299362 A1 10/2014 Park et al.
2015/0173186 A1 6/2015 Na et al.

OTHER PUBLICATIONS

Ju-Hee So, et al., "Reversibly Deformable and Mechanically Tunable Fluidic Antennas", Adv. Funct. Mater., vol. 19, pp. 3632-3637, Sep. 30, 2009.

(Continued)

*Primary Examiner* — Caleen Sullivan
(74) *Attorney, Agent, or Firm* — Rabin & Berdo, P.C.

(57) ABSTRACT

Provided is a method for manufacturing a stretchable wire, the method including removing a portion of a photoresist layer on a substrate to form a photoresist pattern comprising at least one pattern slit, applying a liquid-phase conductive material on the photoresist pattern to form a liquid-phase conductive structure in the pattern slit, forming a stretchable first insulating layer on the liquid-phase conductive structure, after removing the photoresist pattern, and separating the liquid-phase conductive structure and the first insulating layer from the substrate.

18 Claims, 10 Drawing Sheets

(52) U.S. Cl.
CPC ...... *H01L 24/82* (2013.01); *H01L 2221/6835* (2013.01); *H01L 2224/24137* (2013.01)

(58) Field of Classification Search
CPC ............. H01L 23/4985; H01L 21/0274; H01L 21/7685; H01L 23/5387; H01L 24/85; H01L 24/43; H01L 2224/85085; H01L 2224/85002; H01L 2224/43985
USPC ........................................................ 438/618
See application file for complete search history.

(56) References Cited

OTHER PUBLICATIONS

Seung Hee Jeong, et al., "Liquid Alloy Printing of Microfluidic Stretchable Electronics", Lab on a Chip, vol. 12, pp. 4657-4664, Sep. 17, 2012.

Rebecca K. Kramer, et al., "Masked Deposition of Gallium-Indium Alloys for Liquid-Embedded Elastomer Conductors", Adv. Funct. Mater., vol. 23, pp. 5292-5296, May 16, 2013.

\* cited by examiner

METHOD FOR MANUFACTURING STRETCHABLE WIRE AND METHOD FOR MANUFACTURING STRETCHABLE INTEGRATED CIRCUIT

CROSS-REFERENCE TO RELATED APPLICATIONS

This U.S. non-provisional patent application claims priority under 35 U.S.C. §119 of Korean Patent Application No. 10-2015-0118196, filed on Aug. 21, 2015 and Korean Patent Application No 10-2016-0008220, filed on Jan. 22, 2016, the entire contents of which are hereby incorporated by reference.

BACKGROUND

The present disclosure herein relates to a method for manufacturing a stretchable wire and a method for manufacturing a stretchable integrated circuit.

Stretchable electronic devices need to maintain electrical functions even when substrates are expanded by stress applied from the outside. The stretchable electronic devices go beyond limits of simple bendable and/or flexible devices and have applicability in various fields such as a sensor skin for a robot, a wearable communication device, a body-embeddable/attachable bio device, a next-generation display, and the like.

For manufacturing the flexible electronic devices, there is a technique for forming wrinkles in substrate, on which a circuit is to be formed, to secure stretchability of the devices, a technique for using a stretchable and organic conductive material having conductivity instead of a metal wire, or a technique for patterning a metal wire in a stretchable and 2-dimensional planar spring type.

SUMMARY

The present disclosure provides a method for manufacturing a stretchable wire and a stretchable integrated circuit having stretchable and liquid-phase conductive structures.

Issues to be addressed in the present disclosure are not limited to those described above and other issues unmentioned above will be clearly understood by those skilled in the art from the following description.

An embodiment of the inventive concept provides a method for manufacturing a stretchable wire. The method includes: removing a portion of a photoresist layer on a substrate to form a photoresist pattern including at least one pattern slit; applying a liquid-phase conductive material on the photoresist pattern to form a liquid-phase conductive structure in the pattern slit; forming a stretchable first insulating layer on the liquid-phase conductive structure, after removing the photoresist pattern; and separating the liquid-phase conductive structure and the first insulating layer from the substrate.

In an embodiment, the pattern slit may include side walls facing each other, and the side walls make acute angles with the substrate.

In an embodiment, the liquid-phase conductive structure may have a width corresponding to a shortest separation distance between the side walls.

In an embodiment, the liquid-phase conductive structure may extend along the pattern slit.

In an embodiment, the method may further include: forming a stretchable second insulating layer on a lower portion of the liquid-phase conductive structure separated from the substrate.

In an embodiment, the liquid-phase conductive material may include a liquid-phase metal.

In an embodiment, the liquid-phase metal may include an alloy containing gallium (Ga) and indium (In).

In an embodiment, the stretchable first insulating layer may include an elastomer.

In an embodiment, the elastomer may include Poly-Dimethyllesiloxane (PDMS) or polyurethane.

In an embodiment of the inventive concept, a method for manufacturing a stretchable integrated circuit includes: forming a photoresist layer on a substrate on which at least two electronic devices separated from each other are disposed; removing a portion of the photoresist layer to form a photoresist pattern including at least one pattern slit; applying a liquid-phase conductive material on the photoresist pattern to form a liquid-phase conductive structure in the pattern slit; forming a stretchable first insulating layer on the liquid-phase conductive structure and the electronic devices, after removing the photoresist pattern; and separating the liquid-phase conductive structure, the electronic devices, and the first insulating layer from the substrate.

In an embodiment, the pattern slit may include side walls facing each other, and the side walls make acute angles with the substrate.

In an embodiment, a shortest separation distance between the side walls may be formed larger than a separation distance between the electronic devices.

In an embodiment, the liquid-phase conductive material may include a liquid-phase metal.

In an embodiment, the liquid-phase metal may include an alloy containing gallium (Ga) and indium (In).

In an embodiment, the method may further include forming a stretchable second insulating layer on lower portions of the liquid-phase conductive structure, the electronic device, and the first insulating layer, which are separated from the substrate.

In an embodiment, the liquid-phase conductive material may connect the electronic devices separated from each other.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Advantages and features of the present invention, and methods for achieving the same will be cleared with reference to exemplary embodiments described later in detail together with the accompanying drawings. However, the present invention is not limited to the following exemplary embodiments, but realized in various forms. In other words, the present exemplary embodiments are provided just to complete disclosure the present invention and make a person having an ordinary skill in the art understand the scope of the invention. The present invention should be defined by only the scope of the accompanying claims. Throughout this specification, like numerals refer to like elements.

The terms and words used in the following description and claims are to describe embodiments but are not limited the inventive concept. As used herein, the singular forms "a," "an" and "the" are intended to include the plural forms as well, unless the context clearly indicates otherwise. It will be further understood that the terms "comprises" and/or "comprising" used herein specify the presence of stated components, operations and/or elements but do not preclude the presence or addition of one or more other components, operations and/or elements.

Unless otherwise defined, all terms (including technical and scientific terms) used herein have the same meaning as commonly understood by one of ordinary skill in the art to which the invention belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings for explaining a method for manufacturing a stretchable wire and a stretchable integrated circuit.

Figure 1:
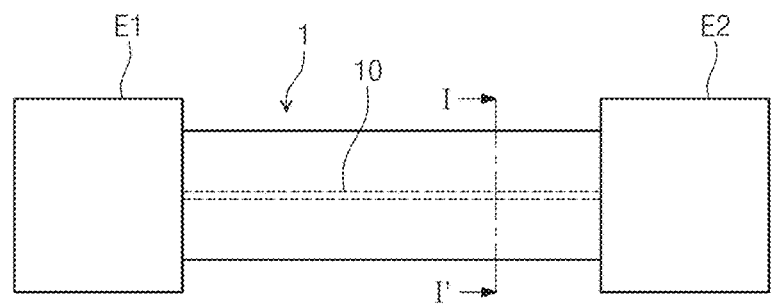
FIG. 1 is a plan view illustrating that electronic devices are connected through a stretchable wire according to an embodiment of the inventive concept.
Figure 2:
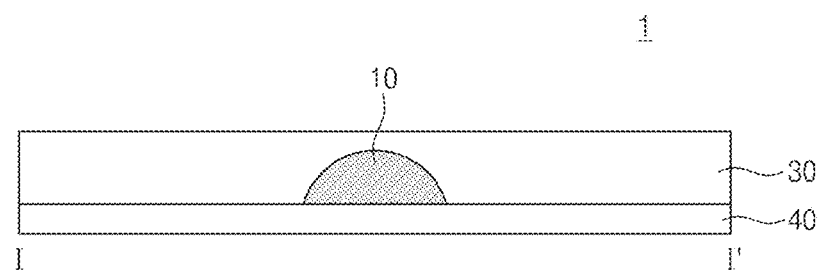
FIG. 2 is a cross-sectional view taken along a line I-I' of FIG. 1.

FIG. 1 is a plan view illustrating that electronic devices are connected through a stretchable wire according to an embodiment of the inventive concept. FIG. 2 is a cross-sectional view taken along a line I-I' of FIG. 1.

Referring to FIGS. 1 and 2, a plurality of electronic devices E1 and E2 may be disposed separately from each other. A stretchable wire 1 may be connected to each of a plurality of electronic devices E1 and E2. For example, each of two electronic devices E1 and E2 may be connected to both ends of the stretchable wire 1.

The stretchable wire 1 is stretchable in at least one direction to be used in a wearable communication device, or a body-embeddable/attachable bio device, etc. In an embodiment of the inventive concept, the stretchable wire 1 may be lengthily formed. The stretchable wire 1 may be stretched in at least one direction. For example, the stretchable wire 1 may be stretched or contracted in a longitudinal direction. Accordingly, the stretchable wire 1 may be freely bended. Unlike this, other stretchable wires may be stretched or contracted in all directions.

The stretchable wire 1 may include a liquid-phase conductive structure 10 and insulating layers 30 and 40. The stretchable wire 1 may include at least one liquid-phase conductive structure 10. In an embodiment of the inventive concept, the stretchable wire 1 may include, but is not limited thereto, one liquid-phase conductive structure 10, and two or more liquid-phase conductive structures may be included.

The liquid-phase conductive structure 10 may be disposed in the insulating layers 30 and 40. For example, the liquid-phase conductive structure 10 may be disposed between a first insulating layer 30 and a second insulating layer 40 to be described later. Accordingly, the liquid-phase conductive structure 10 may be insulated from an external environment by the insulating layers 30 and 40.

The liquid-phase conductive structure 10 may maintain a liquid-phase state at a temperature at which the stretchable wire 1 is used. For example, when the stretchable wire 1 is used at room temperature, the liquid-phase conductive structure 10 may maintain the liquid-phase state at room temperature.

The liquid-phase conductive structure 10 may include a liquid-phase metal having electric conductivity. The liquid-phase metal includes an alloy containing gallium (Ga) and indium (In) maintaining a liquid phase at room temperature, but is not limited thereto. Unlike this, in another embodiment, the liquid-phase conductive structure 10 may include a liquid-phase polymer material maintaining a liquid phase at a temperature at which the stretchable wire 1 is used.

The liquid-phase conductive structure 10 may be formed in a straight line pattern. Unlike this, in another embodiment, the liquid-phase conductive structure 10 may be formed in various patterns such as a zigzag pattern, a curved pattern, a grid pattern, and the like.

The insulating layers 30 and 40 may enclose the liquid-phase conductive structure 10. Accordingly, the insulating layers 30 and 40 may protect the liquid-phase conductive structure 10 from external environment.

The insulating layers 30 and 40 may include a stretchable elastomer. The elastomer may include polydimethylsiloxane (PDMS) or polyurethane. Accordingly, the insulating layers 30 and 40 may be stretched in at least one direction by an external force.

In an embodiment of the inventive concept, the insulating layers 30 and 40 may include the first insulating layer 30 and the second insulating layer 40. The first and second insulating layers 30 and 40 may be formed to be thin. Accordingly, the first and second insulating layers 30 and 40 may be easily stretched by an external force.

The first insulating layer 30 may be disposed on a top portion of the liquid-phase conductive structure 10. For example, the first insulating layer 30 may be disposed to cover the top portion of the liquid-phase conductive structure 10.

The second insulating layer 40 may be disposed on a lower portion of the liquid-phase conductive structure 10. Accordingly, the liquid-phase conductive structure 10 may be disposed between the first insulating layer 30 and the second insulating layer 40. In other words, the first insulating layer 30 and the second insulating layer 40 may form a sandwich structure for enclosing the liquid-phase conductive structure 10 to insulate the liquid-phase conductive structure 10 from an external environment.

The first and second insulating layers 30 and 40 may be formed of the same material. Accordingly, the first and second insulating layers 30 and 40 may have the same modulus of elasticity. In other words, the first and second insulating layers 30 and 40 may be stretched to correspond to each other by an external force. Unlike this, in another embodiment, the first and second insulating layers 30 and 40 may be formed of different materials.

The first and second insulating layers 30 and 40 may have shapes corresponding to each other. In an embodiment of the inventive concept, the first and second insulating layers 30 and 40 may have quadrangle cross sections. Unlike this, in another embodiment, cross sections of the first and second insulating layers 30 and 40 may have various shapes such as a semicircle, a triangle, and the like.

The first and second insulating layers 30 and 40 may be stretched or contracted in at least one direction. For example, the first and second insulating layers 30 and 40 may be stretched in a longitudinal direction of the stretchable wire 1.

The stretchable wire 1 may further include a bonding layer (not illustrated) between the first and second insulating layers 30 and 40 and/or between the liquid-phase conductive structure 10 and the second insulating layer 40. The bonding layer may enhance a bonding strength between the first and second insulating layers 30 and 40 and/or a bonding strength between the liquid-phase conductive structure 10 and the second insulating layer 40.

FIGS. 3 to 13 are drawings sequentially illustrating manufacturing processes of a stretchable wire according to an embodiment of the inventive concept.

Figure 3:
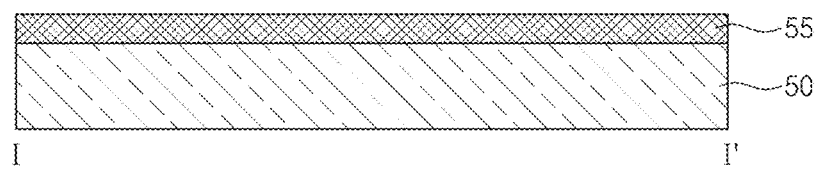
FIGS. 3 to 12 are drawings sequentially illustrating manufacturing processes of a stretchable wire according to an embodiment of the inventive concept.

Referring to FIG. 3, a sacrificial layer 55 may be formed on a substrate 50. For example, the sacrificial layer 55 may be formed on the substrate 50 by performing chemical vapor deposition, physical vapor deposition, or atomic layer deposition.

The substrate 50 may have a flat top portion on which the sacrificial layer 55 is formed. Unlike this, in another embodiment, the substrate may have a curved top portion. The substrate 50 may be any one of a silicon substrate, a glass substrate, an insulating substrate, and a polymer substrate. Since the substrate 50 is removed in a subsequent process, a material thereof is not limited.

The sacrificial layer 55 may be a silicon oxide (for example, $SiO_2$) layer, a silicon nitride (for example, $Si_3N_4$) layer, an aluminum oxide (for example, $Al_2O_3$) layer, or an organic layer. When the substrate 50 is a silicon substrate, the top portion of the silicon substrate is naturally oxidized to form the sacrificial layer 55.

Figure 4:
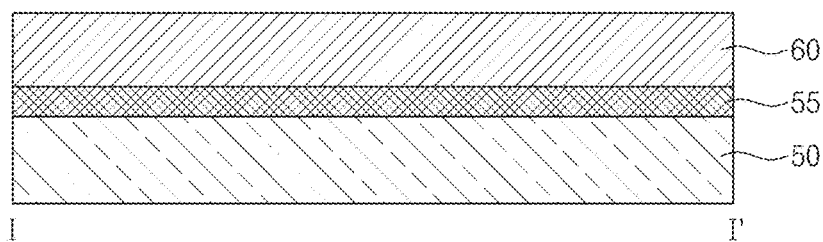

Referring to FIG. 4, a photoresist layer 60 may be formed on the substrate 50. For example, the photoresist layer 60 may be formed by applying photoresist onto the sacrificial layer 55 formed on the substrate 50 through a spin coating method.

Hereinafter, forming on the substrate may mean including both of being disposed while contacting the top portion of the substrate 50 and forming on the sacrificial layer 55 to be separately disposed from the substrate 50.

Figure 5:
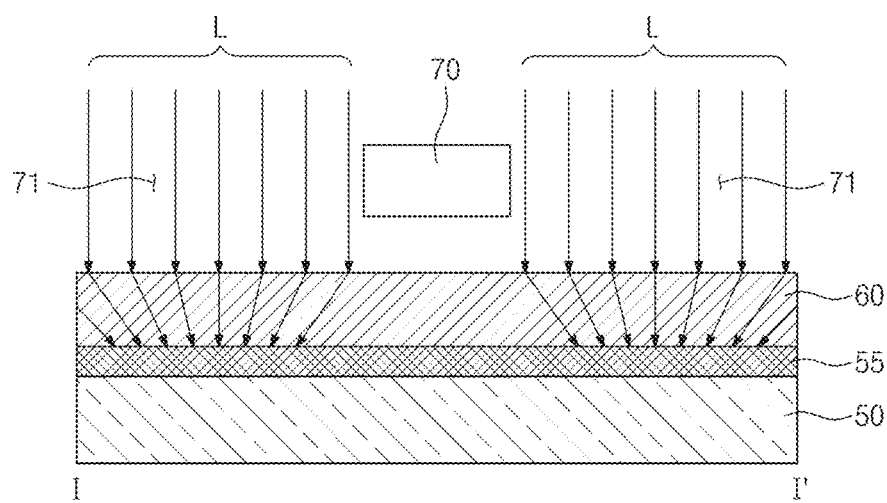

Referring to FIG. 5, a photo mask 70 may be disposed on the photoresist layer 60. The photo mask 70 may include at least one slit 71. In an embodiment of the inventive concept, the photo mask 70 may include two slits 71. The photoresist layer 60 may be exposed to light L through the slits 71 of the photo mask 70.

The photoresist may be a polymer material of which tolerance to drugs varies when exposed to the light L. The photoresist may include a negative type insoluble in drugs and a positive type soluble in drugs when exposed to the light L.

In an embodiment of the inventive concept, the photoresist may be a negative type. Therefore, the photoresist layer 60 exposed to the light L (hereinafter, referred to an exposed region) may remain and the photoresist layer 60 that is not exposed to the light L (hereinafter, referred to an unexposed region) may be removed. Accordingly, in the photoresist layer 60, a pattern slit 65 (see FIG. 6) may be formed in a region that is not exposed to the light L through the slits 71 of the photo mask 70.

The light L incident to the photoresist layer 60 may be refracted to be collected on the photoresist layer 60. Accordingly, the light L incident to between the exposed region and the unexposed region is refracted to form an acute angle with the substrate 50 and the pattern slit 65 (see FIG. 7) to be described later may include side walls 65a and 65b (see FIG. 7) forming acute angles $\theta_1$ and $\theta_2$ with the substrate 50.

Figure 6:
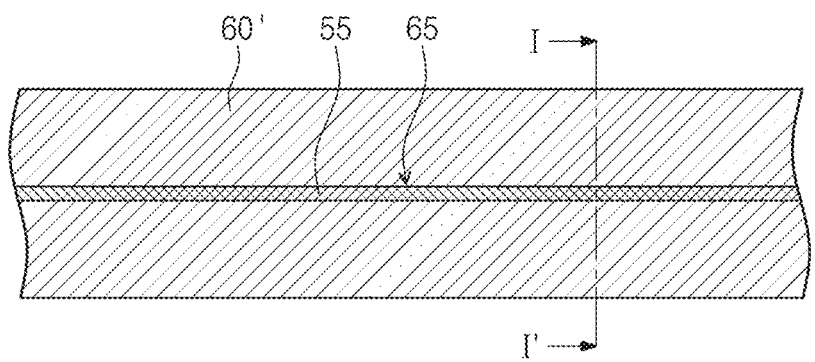
Figure 7:
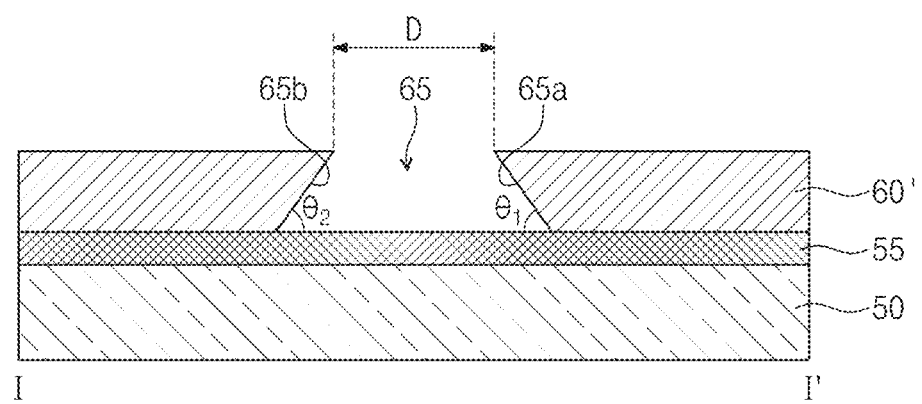

FIG. 6 is a plan view illustrating a photoresist pattern formed in a photolithography process of FIG. 5. FIG. 7 is a cross-sectional view taken along a line I-I' of FIG. 6.

Referring to FIGS. 6 and 7, a portion of the photoresist layer 60 may be removed. Accordingly, the photoresist pattern 60' may include at least one pattern slit 65 for exposing a portion of the sacrificial layer 55 on the substrate 50.

In an embodiment of the inventive concept, the pattern slit 65 may be formed in the photoresist pattern 60 through the photolithography process. The pattern slit 65 may expose a portion of the sacrificial layer 55 on the substrate 50.

The pattern slit 65 in the photoresist pattern 60' may include side walls 65a and 65b facing each other. The side walls 65a and 65b may form the acute angles $\theta_1$ and $\theta_2$ with the substrate 50. In other words, the side walls 65a and 65b may have a reverse slope structure. The reverse slope structure may mean a structure that a separation distance between the side walls 65a and 65b is constantly decreased as they are away from the substrate 50. Accordingly, in a subsequent process that a liquid-phase conductive material is applied to the photoresist pattern 60' and a portion exposed by the pattern slit 65, the liquid-phase material may not be applied on the side walls 65a and 65b.

In an embodiment of the inventive concept, the pattern slit 65 may be formed in a straight line pattern. Unlike this, in another embodiment, the pattern slit 65 may be formed by the slits 71 (see FIG. 5) of the photo mask 70 (see FIG. 5) in various patterns such as a zigzag pattern, a curve pattern, a grid pattern, and the like.

Figure 8:
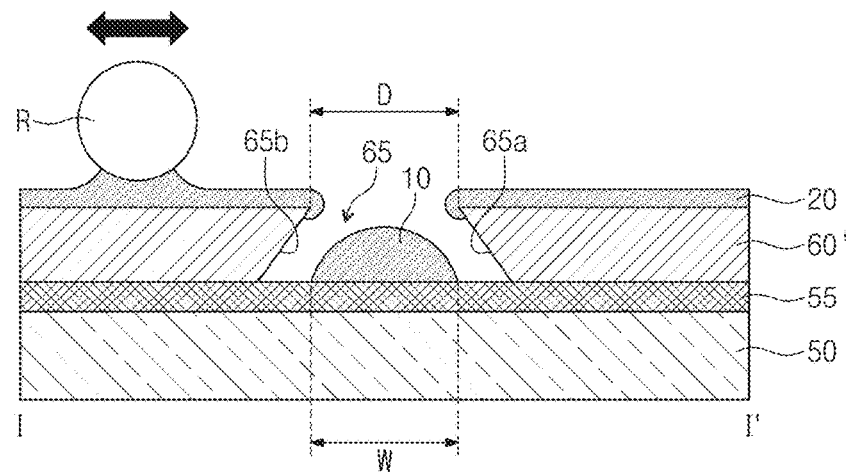

Referring to FIG. 8, after the pattern slit 65 is formed in the photoresist pattern 60', the liquid-phase conductive material may be applied to the photoresist pattern 60' and the portion exposed by the pattern slit 65.

In an embodiment of the inventive concept, the liquid-phase conductive material may be applied, through a roller, on the photoresist pattern 60' and the sacrificial layer 55 exposed by the pattern slit 65. Accordingly, a liquid-phase conductive material layer 20 may be formed on the photoresist pattern 60'. In addition, the liquid-phase conductive structure 10 may be formed in the pattern slit 65. For example, the liquid conductive structure 10 may be formed on the sacrificial layer 55 exposed by the pattern slit 65.

The liquid-phase conductive structure 10 may have a width corresponding to a shortest separation distance D between the side walls 65a and 65b. In other words, the liquid-phase conductive structure 10 may have a width within an error range with the shortest separation distance D of the side walls 65a and 65b. Accordingly, the stretchable wire 1 (see FIG. 1) may adjust the shortest separation distance D between the side walls 65a and 65b through the photolithography process to realize a fine width W of the liquid-phase conductive structure 10. Here, the error range is related to viscosity of the liquid-phase conductive material. Accordingly, when the viscosity of the liquid-phase conductive material is high, the width W of the liquid-phase conductive material 10 may be finely smaller than the shortest separation distance D of the side walls 65a and 65b. However, when the viscosity of the liquid-phase conductive material is low, the width W of the liquid-phase conductive structure 10 may be finely larger than the shortest separation distance D of the side walls 65a and 65b.

Figure 9:
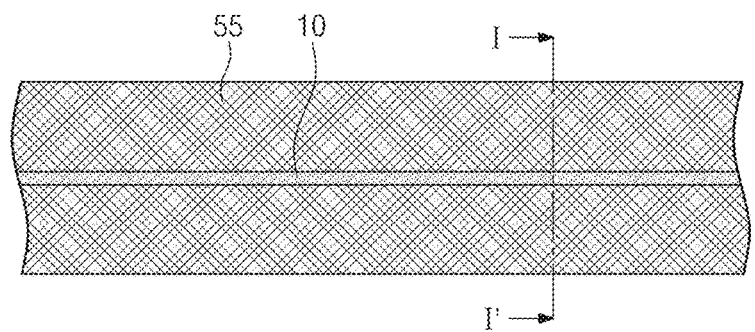
Figure 10:
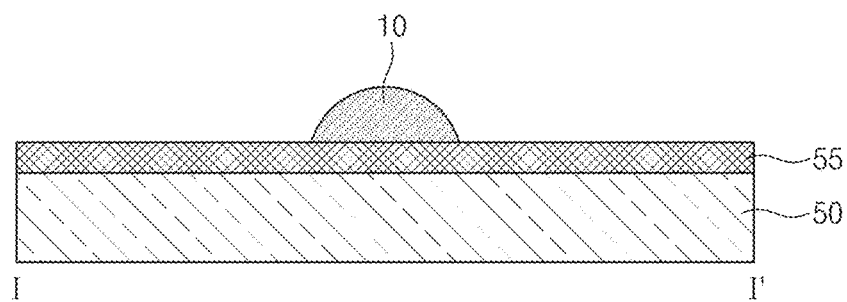

FIG. 9 is a plan view illustrating that the photoresist pattern and the liquid-phase conductive material layer are removed after the liquid-phase conductive structure is formed. FIG. 10 is a cross-sectional view taken along a line I-I' of FIG. 9.

Referring to FIGS. 9 and 10, the liquid-phase conductive material layer 20 (see FIG. 8) on the photoresist pattern 60' (see FIG. 8) and the photoresist pattern 60' may be removed from the substrate 50. For example, the substrate 50 on which the photoresist pattern 60' and the liquid-phase conductive material layer 20 are stacked is immersed in a photoresist striper solution for a certain time, the photoresist pattern 60' and the liquid-phase conductive material layer 20 may be removed from the substrate 50. When the sacrificial layer 55 is an organic layer, an additional process may be performed in order not to be removed with the photoresist pattern 60'.

The liquid-phase conductive structure 10 may have a pattern corresponding to a planar shape of the pattern slit 65 (see FIG. 7). Accordingly, the liquid-phase conductive structure 10 may extend along the pattern slit 65. For example, when the pattern slit 65 has a zigzag pattern, the liquid-phase conductive structure 10 may have a zigzag pattern. When the pattern slit 65 is formed in a complex and fine pattern through the photolithography process, the liquid-phase conductive structure 10 may be realized in a complex and fine pattern.

Figure 11:
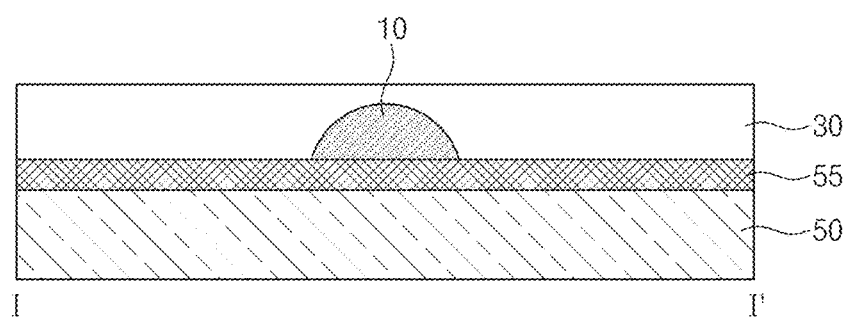

Referring to FIG. 11, the first insulating layer 30 may be formed on the liquid-phase conductive structure 10 and the substrate 50. For example, the first insulating layer 30 may be formed by applying an insulating material on the substrate 50 and the liquid-phase conductive structure 10 after the photoresist pattern 60' (see FIG. 8) and the liquid-phase conductive material layer 20 (see FIG. 8) are removed. As described above, the first insulating layer 30 may include an elastomer of PDMS or polyurethane.

Figure 12:
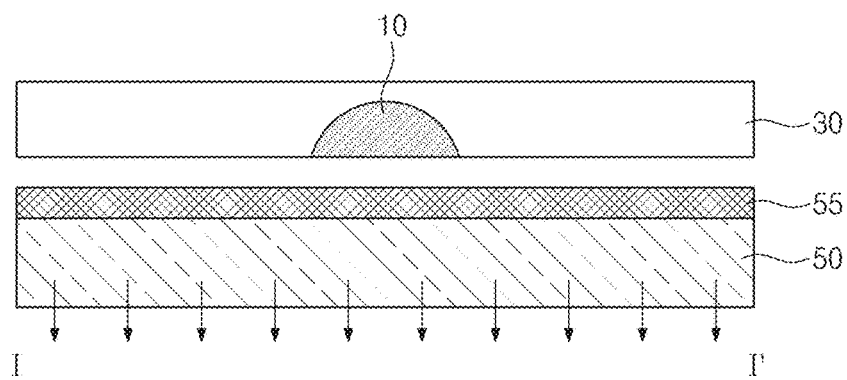

Referring to FIG. 12, the first insulating layer 30 and the liquid-phase conductive structure 10 may be separated from the sacrificial layer 55 of the substrate 50 by an external force. Accordingly, the lower portion of the liquid-phase conductive structure 10 may be not protected from an external environment to cause a danger such as a short circuit.

Referring to FIGS. 1 and 2 again, the stretchable second insulating layer 40 may be formed on the lower portion of the first insulating layer 20 and a lower portion of the liquid-phase conductive structure 10, which are separated from the substrate 50. In other words, the first insulating layer 30 and the second insulating layer 40 may form a sandwich structure enclosing the liquid-phase conductive structure 10. Accordingly, the liquid-phase conductive structure 10 may be protected from an external environment. As described above, the second insulating layer 40 may include an elastomer of PDMS or polyurethane. Accordingly, the stretchable wire 1 may be manufactured while a plurality of electronic devices E1 and E2 are electrically connected.

Figure 13:
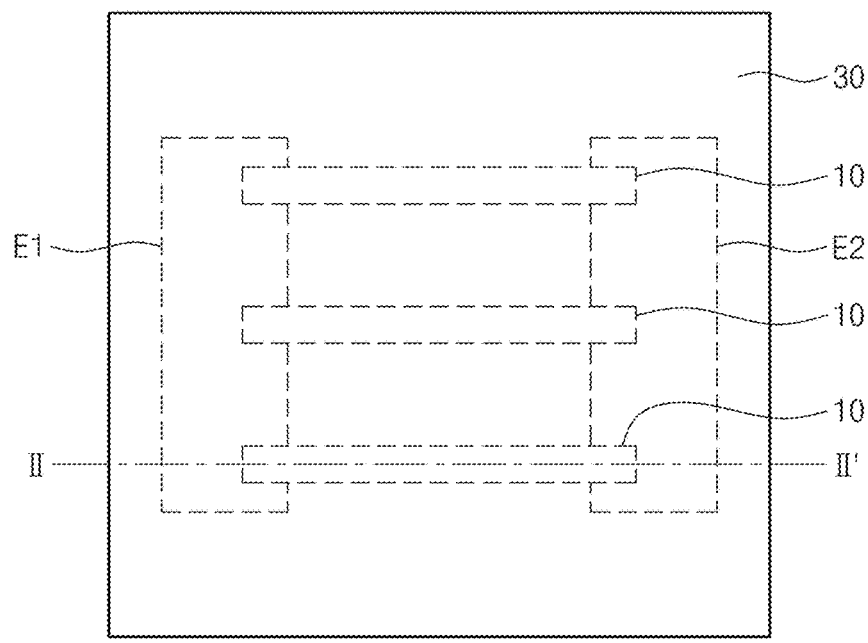
FIG. 13 is a plan view illustrating a stretchable integrated circuit according to an embodiment of the inventive concept.
Figure 14:
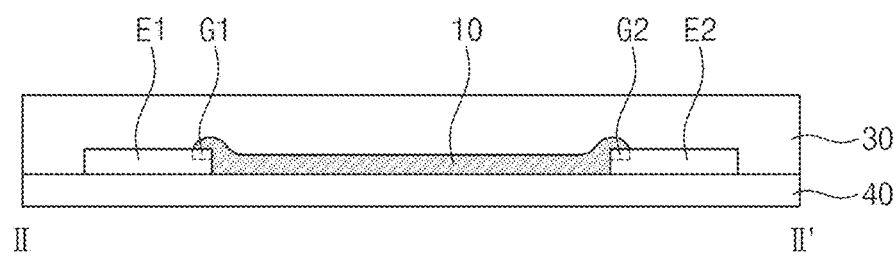
FIG. 14 is a cross-sectional view taken along a line II-II' of FIG. 13.

FIG. 13 is a plan view illustrating a stretchable integrated circuit according to an embodiment of the inventive concept. FIG. 14 is a cross-sectional view taken along a line II-II' of FIG. 13. For conciseness of explanation, descriptions on components substantially same as those in the example described in relation to FIG. 1 will be omitted.

Referring to FIGS. 13 and 14, a stretchable integrated circuit 2 according to an embodiment of the inventive concept may include electronic devices E1 and E2, the liquid-phase conductive structure 10 and the insulating layers 30 and 40. The stretchable integrated circuit 2 may be stretched in at least one direction. Accordingly, the stretchable integrated circuit 2 may be freely bended. Unlike this, other stretchable integrated circuits may be stretched or contracted in all directions.

At least two of the plurality of electronic devices E1 and E2 may be separately disposed from each other.

The electronic devices E1 and E2 may respectively include at least one electrode G1 and G2. In an embodiment of the inventive concept, each of the electronic devices E1 and E2 may include three electrodes G1 and G2. The electronic devices E1 and E2 may receive power or transmit or receive data signals through the electrodes G1 and G2. For example, the electrodes G1 and G2 may be source and/or drain electrodes. The electronic devices may be disposed in the insulating layers 30 and 40.

The liquid-phase conductive structure 10 may electrically connect at least two electronic devices separately disposed from each other. For example, the liquid-phase conductive structure 10 may be connected to the electrodes G1 and G2 of the electronic devices E1 and E2 to electrically connect the separated electronic devices E1 and E2. The liquid-phase conductive structure 10 may have, but is not limited thereto, a straight line shape and have various shapes such as a zigzag shape, and a curved shape.

One end of the liquid-phase conductive structure 10 may cover a portion of a first electronic device E1. Accordingly, the liquid-phase conductive structure 10 may be electrically connected to the electrode G1 of the first electronic device E1. In addition, the other end of the liquid-phase conductive structure 10 may cover a portion of a second electronic device E2. Accordingly, the liquid-phase conductive structure 10 may be electrically connected to the electrode G2 of the second electronic device E2.

The liquid-phase conductive structure 10 may include a liquid-phase metal having electric conductivity. The liquid-phase conductive structure 10 may be disposed in the insulating layers 30 and 40.

The insulating layers 30 and 40 may enclose the electronic devices E1 and E2, and the liquid-phase conductive structure 10. Accordingly, the insulating layers 30 and 40 may protect the electronic devices E1 and E2, and the liquid-phase conductive structure 10 from an external environment. The insulating layers 30 and 40 may include a stretchable elastomer.

FIGS. 15 to 22 are drawings sequentially illustrating manufacturing processes of a stretchable integrated circuit according to an embodiment of the inventive concept. For conciseness of explanation, descriptions on components substantially same as those in the example described in relation to FIGS. 3 to 12 will be omitted.

Figure 15:
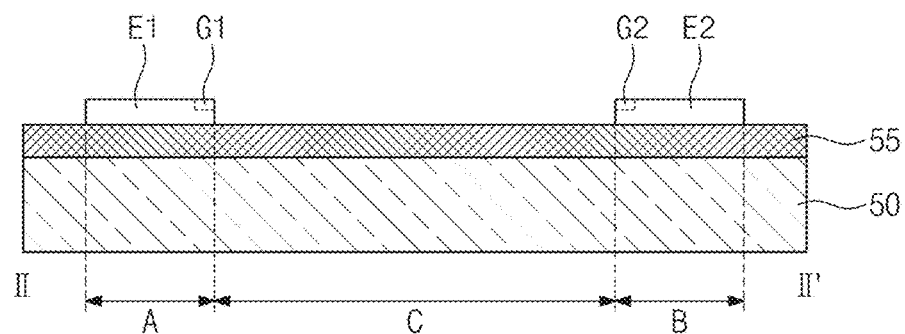
FIGS. 15 to 22 are drawings sequentially illustrating manufacturing processes of a stretchable integrated circuit according to an embodiment of the inventive concept.

Referring to FIG. 15, at least two electronic devices E1 and E2 may be separately disposed on the substrate 50. For example, the electronic devices E1 and E2 may be separately disposed on the sacrificial layer 55.

The stretchable integrated circuit 2 in an embodiment of the inventive concept may include the first electronic device E1 disposed in a first region A of the substrate 50 and the second electronic device E2 disposed in a second region B of the substrate 50 and separated from the first electronic device E1. Here, the substrate 50 may include the first region A in which the first electronic device E1 is disposed and the second region B in which the second electronic device E2 is disposed. In addition, the substrate 50 may include a third region C between the first and second electronic devices E1 and E2.

Figure 16:
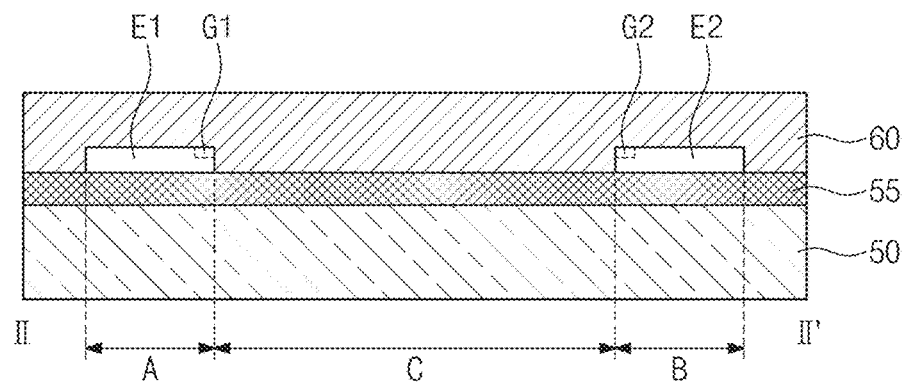

Referring to FIG. 16, a photoresist may be applied on the substrate 50 on which at least the two electronic devices E1 and E2 separated from each other are disposed. Accordingly, the photoresist layer 60 may be disposed on the substrate 50 and the electronic devices E1 and E2.

Figure 17:
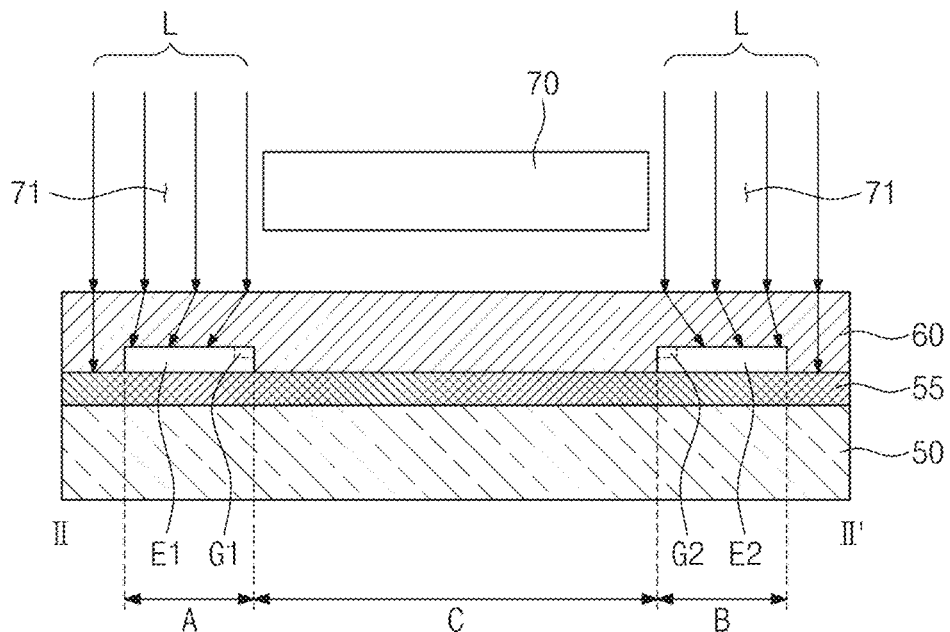
Figure 18:
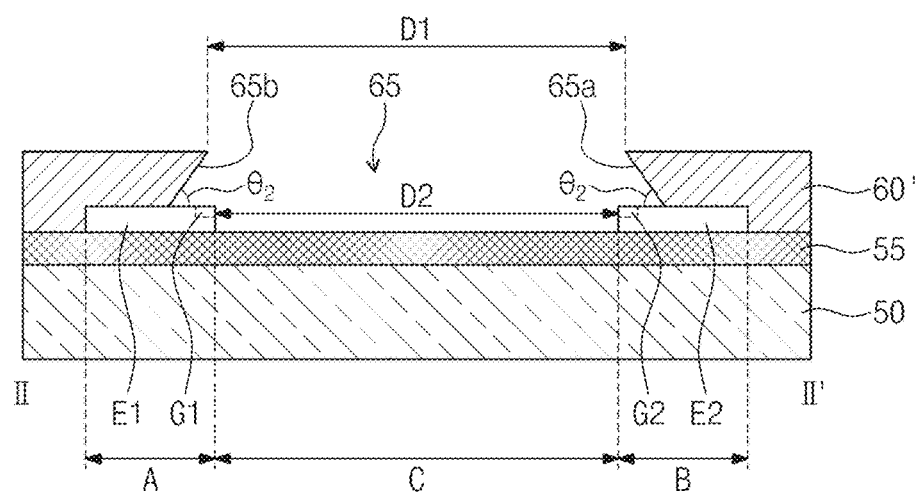

Referring to FIGS. 17 and 18, a portion of the photoresist layer 60 may be removed. Accordingly, in an embodiment of the inventive concept, the photoresist pattern 60' may include at least one pattern slit 65 for exposing a portion of the sacrificial layer 55 and a portion of the electronic devices E1 and E2 on the substrate 50. Unlike this, in another embodiment of the inventive concept, the photoresist pattern 60' may include at least one pattern slit 65 for exposing a portion of the substrate 50 and a portion of the electronic devices E1 and E2.

In an embodiment of the inventive concept, the pattern slit 65 may be formed in the photoresist pattern 60 through the photolithography process. The pattern slit 65 may include side walls 65a and 65b facing each other. The side walls 65a and 65b may form the acute angles $\theta_1$ and $\theta_2$ with the substrate 50. In other words, the side walls 65a and 65b may have a reverse slope structure.

The shortest separated distance D1 between the side walls 65a and 65B may be formed larger than a separation distance D2 between the electronic devices E1 and E2 separated from each other. Accordingly, the pattern slit 65 may externally expose the sacrificial layer 55 corresponding to the third region C of the substrate 50, a portion of the first electronic device E1, and a portion of the second electronic device E2.

Figure 19:
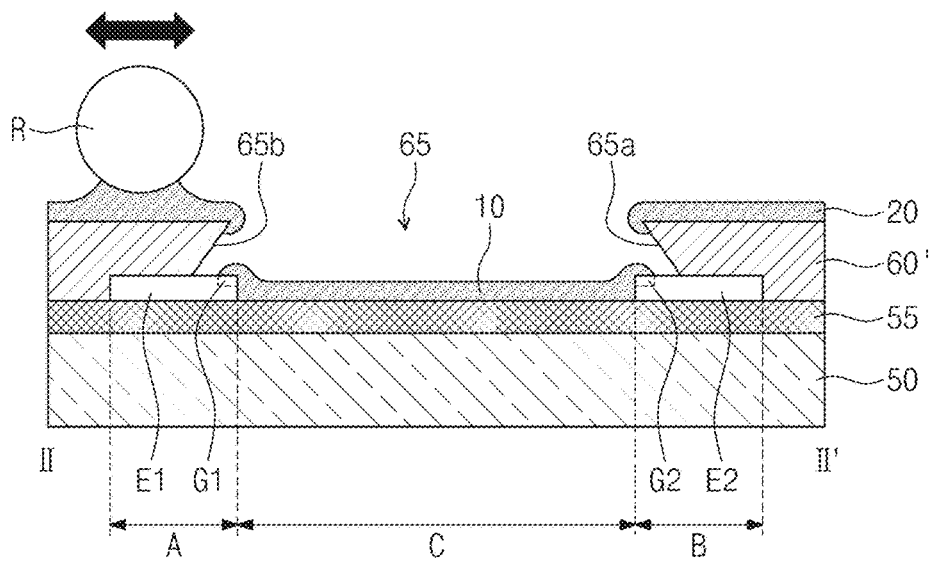

Referring to FIG. 19, after the pattern slit 65 is formed in the photoresist pattern 60', the liquid-phase conductive material may be applied on the photoresist pattern 60' and a portion exposed by the pattern slit 65. Accordingly, a liquid-phase conductive material layer 20 may be formed on the photoresist pattern 60'. In addition, the liquid-phase conductive structure 10 may be formed in the pattern slit 65. For example, the liquid-phase conductive structure 10 may be formed on the sacrificial layer 55, the portion of the first electronic device E1, and the portion of the second electronic device E2, which are exposed by the pattern slit 65. Here, the sacrificial layer 55 exposed by the pattern slit 65 may mean a portion of the sacrificial layer 55 corresponding to the third region C of the substrate 50.

Accordingly, the liquid-phase conductive structure 10 may be formed such that one end thereof covers a portion of the top portion of the first electronic device E1 and the other end covers a portion of the top portion of the second electronic device E2. The electronic devices E1 and E2 separated from each other may be respectively electrically connected to both ends of the liquid-phase conductive structure 10.

The liquid-phase conductive structure 10 may have a pattern corresponding to the planar shape of the pattern slit 65. Accordingly, the liquid-phase conductive structure 10 may extend along the pattern slit 65. For example, when the pattern slit 65 has a zigzag pattern, the liquid-phase conductive structure 10 may have a zigzag pattern. The liquid-phase conductive material may include a liquid-phase metal including an alloy containing gallium (Ga) and indium (In).

Figure 20:
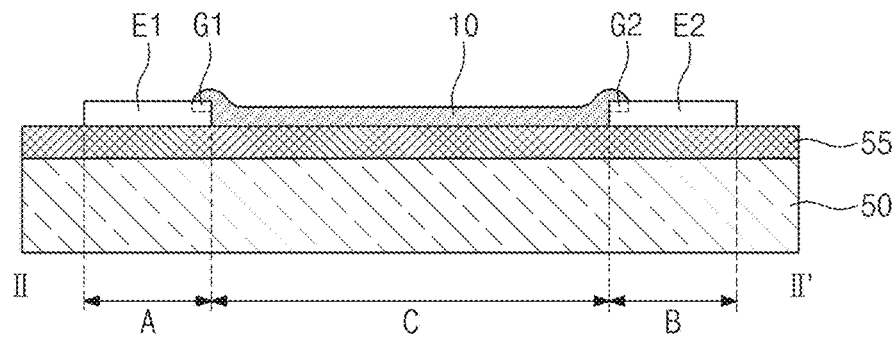

Referring to FIG. 20, the liquid-phase conductive material layer 20 (see FIG. 19) and the photoresist pattern 60' (see FIG. 19) may be removed from the substrate 50.

Figure 21:
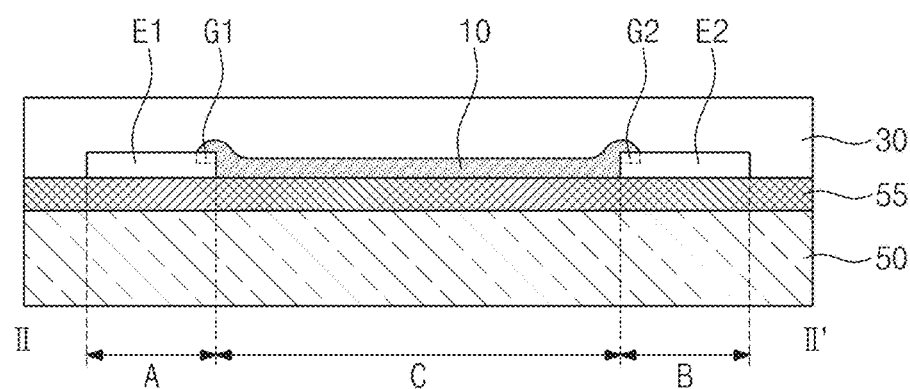

Referring to FIG. 21, the first insulating layer 30 may be formed on the electronic devices E1 and E2, and the liquid-phase conductive structure 10. The first insulating layer 30 may be formed on the substrate 50 or the sacrificial layer 55. The first insulating layer 30 may include an elastomer of PDMS or polyurethane.

Figure 22:
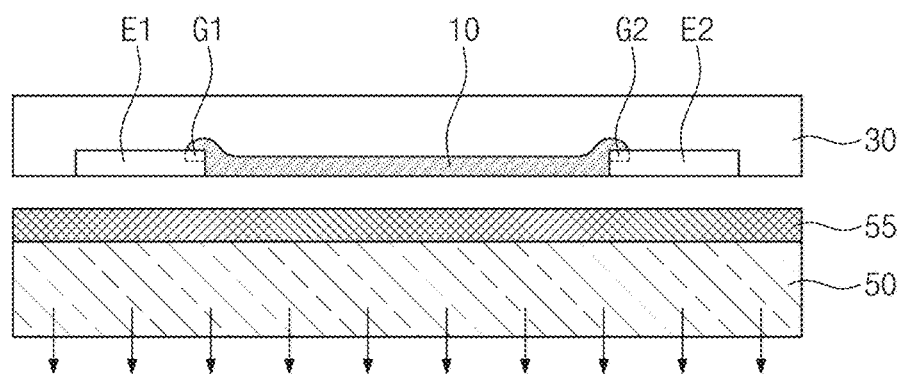

Referring to FIG. 22, the first insulating layer 30, the liquid-phase conductive structure 10, and the electronic devices E1 and E2 may be separated from the sacrificial layer 55 of the substrate 50 by an external force.

Referring to FIGS. 13 and 14 again, the stretchable second insulating layer 40 may be formed on lower portions of the electronic devices E1 and E2, the first insulating layer 30, and the liquid-phase conductive structure 10, which are separated from the substrate 50. Accordingly, the stretchable integrated circuit 2 may be completed. The second insulating layer 40 may include an elastomer of PDMS or polyurethane. Accordingly, each of the electronic devices E1 and E2 may be electrically connected to manufacture the stretchable integrated circuit.

According to a method for manufacturing a stretchable wire and a stretchable integrated circuit, a liquid-phase conductive structure having a fine width may be formed to realize a wire having a complex and fine pattern. In addition, integration may be realized by connecting electronic devices with a wire having a complex and fine pattern.

The effects of the present disclosure are not limited to the above mentioned effects, and other effects not mentioned above may be clearly understood through claims by those skilled in the art.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a stretchable wire, the method comprising:
    removing a portion of a photoresist layer provided on a substrate to form a photoresist pattern comprising at least one pattern slit;
    applying a liquid-phase conductive material comprised of a liquid-phase metal comprising a gallium-based liquid alloy on the photoresist pattern to form a liquid-phase conductive structure in the pattern slit;
    forming a stretchable first insulating layer on the liquid-phase conductive structure, after removing the photoresist pattern; and
    separating the liquid-phase conductive structure and the first insulating layer from the substrate.

2. The method of claim 1, wherein the pattern slit comprises side walls that face each other, and the side walls make acute angles with the substrate.

3. The method of claim 2, wherein the liquid-phase conductive structure has a width corresponding to a shortest separation distance between the side walls.

4. The method of claim 1, wherein the liquid-phase conductive structure extends along the pattern slit.

5. The method of claim 1, wherein the gallium-based liquid alloy comprises an alloy containing gallium (Ga) and indium (In).

6. The method of claim 1, wherein the stretchable first insulating layer comprises an elastomer.

7. The method of claim 6, wherein the elastomer comprises Poly-Dimethyllesiloxane (PDMS) or polyurethane.

8. A method for manufacturing a stretchable wire, the method comprising:
    removing a portion of a photoresist layer provided on a substrate to form a photoresist pattern comprising at least one pattern slit;

applying a liquid-phase conductive material on the photoresist pattern to form a liquid-phase conductive structure in the pattern slit;

forming a stretchable first insulating layer on the liquid-phase conductive structure, after removing the photoresist pattern;

separating the liquid-phase conductive structure and the first insulating layer from the substrate; and forming a stretchable second insulating layer on a lower portion of the liquid-phase conductive structure that is separated from the substrate.

9. The method of claim 8, wherein the liquid-phase conductive material is comprised of a liquid-phase metal comprising a gallium-based liquid alloy.

10. The method of claim 9, wherein the gallium-based liquid alloy of the liquid-phase metal comprises an alloy containing gallium (Ga) and indium (In).

11. The method of claim 8, wherein the stretchable first insulating layer and the stretchable second insulating layer comprise an elastomer.

12. The method of claim 11, wherein the elastomer comprises Poly-Dimethyllesiloxane (PDMS) or polyurethane.

13. A method for manufacturing a stretchable integrated circuit, the method comprising:

forming a photoresist layer provided on a substrate on which at least two electronic devices are disposed and are separated from each other;

removing a portion of the photoresist layer to form a photoresist pattern comprising at least one pattern slit;

applying a liquid-phase conductive material comprised of a liquid-phase metal comprising a gallium-based liquid alloy on the photoresist pattern to form a liquid-phase conductive structure in the pattern slit;

forming a stretchable first insulating layer on the liquid-phase conductive structure and the at least two electronic devices, after removing the photoresist pattern; and separating the liquid-phase conductive structure, the at least two electronic devices, and the first insulating layer from the substrate.

14. The method of claim 13, wherein the pattern slit comprises side walls that face each other, and the side walls make acute angles with the substrate.

15. The method of claim 14, wherein a shortest separation distance between the side walls is formed larger than a separation distance between the at least two electronic devices.

16. The method of claim 13, wherein the gallium-based liquid alloy comprises an alloy containing gallium (Ga) and indium (In).

17. The method of claim 13, further comprising forming a stretchable second insulating layer on lower portions of the liquid-phase conductive structure, the at least two electronic devices, and the first insulating layer, which are separated from the substrate.

18. The method of claim 13, wherein the liquid-phase conductive material connects the at least two electronic devices which are separated from each other.

* * * * *